(12) United States Patent
Palm et al.

(10) Patent No.: US 11,632,860 B2
(45) Date of Patent: Apr. 18, 2023

(54) POWER ELECTRONIC ASSEMBLY AND METHOD OF PRODUCING THEREOF

(71) Applicant: Infineon Technologies AG, Neubiberg (DE)

(72) Inventors: Petteri Palm, Regensburg (DE); Martin Benisek, Regensburg (DE); Liu Chen, Oberhaching (DE); Frank Daeche, Unterhaching (DE); Josef Maerz, Oberhaching (DE)

(73) Assignee: Infineon Technologies AG, Neubiberg (DE)

( * ) Notice: Subject to any disclaimer, the term of this patent is extended or adjusted under 35 U.S.C. 154(b) by 160 days.

(21) Appl. No.: 16/663,947

(22) Filed: Oct. 25, 2019

(65) Prior Publication Data
US 2021/0127490 A1 Apr. 29, 2021

(51) Int. Cl.
*H05K 1/18* (2006.01)
*H05K 1/02* (2006.01)
*H05K 1/03* (2006.01)

(52) U.S. Cl.
CPC ............ *H05K 1/181* (2013.01); *H05K 1/021* (2013.01); *H05K 1/0298* (2013.01); *H05K 1/0306* (2013.01)

(58) Field of Classification Search
CPC .... H05K 1/021; H05K 1/0263; H05K 1/0298; H05K 1/0306; H05K 1/181; H05K 1/185; H05K 2201/10166
See application file for complete search history.

(56) References Cited

U.S. PATENT DOCUMENTS

| 4,978,914 | A | * | 12/1990 | Akimoto | H05K 1/0212 324/750.03 |
| 5,581,443 | A | * | 12/1996 | Nakamura | G06F 1/1616 257/712 |
| 8,811,019 | B2 | | 8/2014 | Gottwald et al. | |
| 9,860,990 | B1 | * | 1/2018 | Lee | H05K 1/021 |
| 10,764,990 | B1 | * | 9/2020 | Chen | H05K 1/021 |

(Continued)

FOREIGN PATENT DOCUMENTS

| DE | 102017210349 A1 | 12/2018 | |
| WO | 2015135734 A1 | 9/2015 | |
| WO | WO-2015135734 A1 | * 9/2015 | ........... H05K 1/0203 |

*Primary Examiner* — William H. Mayo, III
*Assistant Examiner* — Rhadames Alonzo Miller
(74) *Attorney, Agent, or Firm* — Murphy, Bilak & Homiller, PLLC

(57) ABSTRACT

A power electronic assembly includes a board having metal layers laminated onto or between electrically insulating layers, and a power device embedded in the board. A first metal layer provides electrical contacts at a first side of the board. A second metal layer provides a thermal contact at a second side of the board. A third metal layer is positioned between the first metal layer and the power device and configured to distribute a load current switched by the power device. A fourth metal layer is positioned between the second metal layer and the power device and configured as a primary thermal conduction path for heat generated by the power device during switching of the load current. A first electrically insulating layer separates the fourth metal layer from the second metal layer so that the fourth metal layer is electrically isolated from but thermally connected to the second metal layer.

20 Claims, 10 Drawing Sheets

(56) References Cited

U.S. PATENT DOCUMENTS

| | | | | |
|---|---|---|---|---|
| 2004/0107569 | A1* | 6/2004 | Guzek | H01L 23/49827 29/846 |
| 2007/0096292 | A1* | 5/2007 | Machida | H01L 21/4857 257/700 |
| 2010/0065256 | A1* | 3/2010 | Wilcoxon | F28F 21/089 165/104.31 |
| 2010/0314352 | A1* | 12/2010 | Chen | H01L 24/19 216/13 |
| 2011/0001247 | A1* | 1/2011 | Jobetto | H01L 24/19 257/774 |
| 2012/0118615 | A1* | 5/2012 | Lee | B32B 15/08 174/252 |
| 2012/0186861 | A1* | 7/2012 | Shimizu | H01L 23/5389 174/255 |
| 2012/0319260 | A1* | 12/2012 | Kim | H01L 23/49531 257/676 |
| 2012/0326292 | A1* | 12/2012 | Ohashi | H01L 23/3677 257/690 |
| 2013/0003314 | A1* | 1/2013 | Igarashi | H01L 24/19 361/719 |
| 2015/0201500 | A1* | 7/2015 | Shinar | B29C 64/135 425/132 |
| 2015/0380356 | A1 | 12/2015 | Chauhan et al. | |
| 2016/0128197 | A1* | 5/2016 | Standing | H05K 3/32 361/717 |
| 2016/0278200 | A1* | 9/2016 | Costes | H05K 1/0298 |
| 2017/0012030 | A1* | 1/2017 | Wang | H01L 24/32 |
| 2017/0084810 | A1* | 3/2017 | Klein | H05K 1/0373 |
| 2017/0303385 | A1* | 10/2017 | Ikeda | H01L 23/3672 |
| 2017/0325327 | A1* | 11/2017 | Smith | H05K 1/0263 |
| 2018/0213634 | A1* | 7/2018 | Tuominen | H05K 7/20 |
| 2018/0263111 | A1* | 9/2018 | Sperber | H05K 1/021 |
| 2019/0110357 | A1* | 4/2019 | Gavagnin | H05K 1/185 |
| 2019/0115276 | A1* | 4/2019 | Hu | F21V 19/005 |
| 2019/0116670 | A1* | 4/2019 | Anderson | H05K 1/021 |
| 2019/0123030 | A1 | 4/2019 | Mrad et al. | |
| 2019/0159332 | A1* | 5/2019 | Ishibashi | H05K 1/0274 |
| 2019/0174619 | A1* | 6/2019 | Lassmann | H05K 1/0209 |
| 2019/0200446 | A1* | 6/2019 | Long | G06F 1/203 |
| 2019/0206759 | A1* | 7/2019 | Viswanathan | H01L 23/367 |
| 2019/0252756 | A1* | 8/2019 | Lee | H01L 23/10 |
| 2019/0254200 | A1* | 8/2019 | Jenkins | H05K 1/181 |
| 2020/0008291 | A1* | 1/2020 | Brandenburg | H05K 7/20336 |
| 2020/0120786 | A1* | 4/2020 | Sotome | H02M 7/48 |
| 2020/0137870 | A1* | 4/2020 | Ito | H05K 7/20481 |
| 2020/0176347 | A1* | 6/2020 | Costa | H01L 23/498 |

* cited by examiner

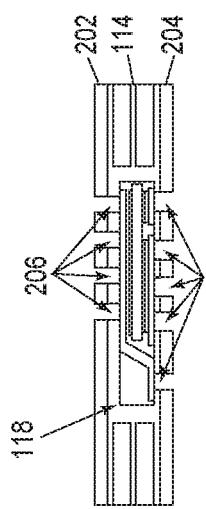
Figure 2C
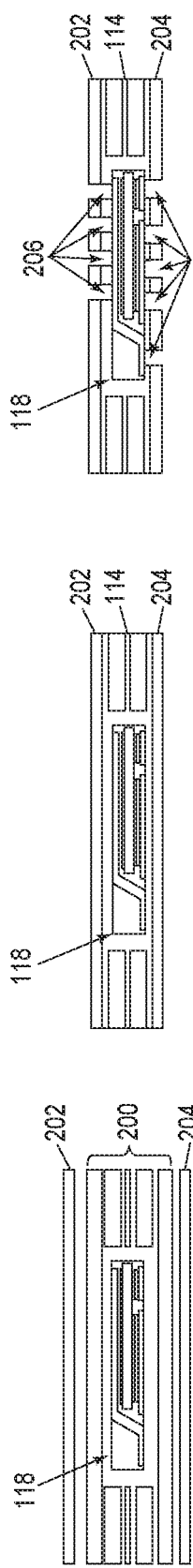
Figure 2F
Figure 2I
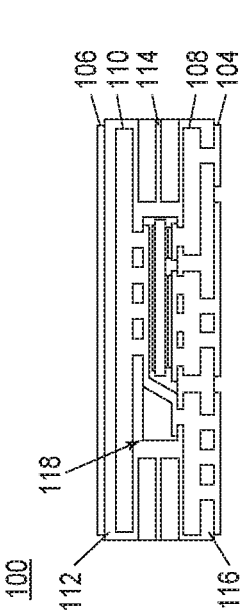
Figure 2B
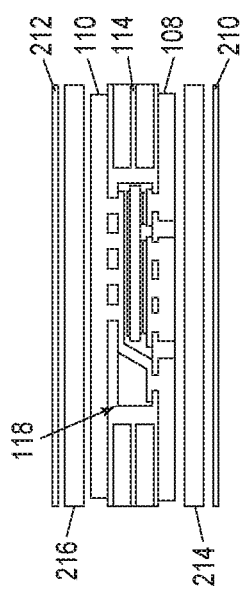
Figure 2E
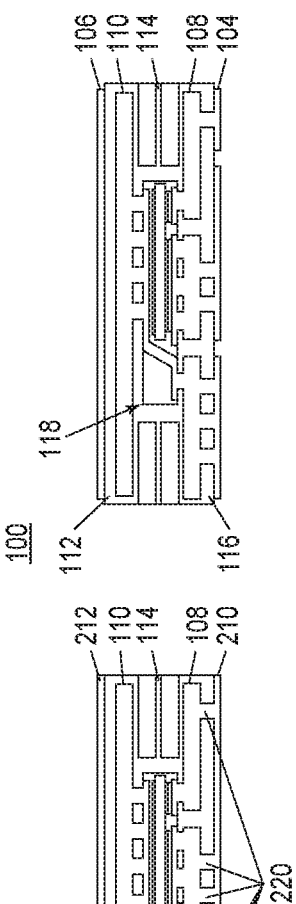
Figure 2H
Figure 2A
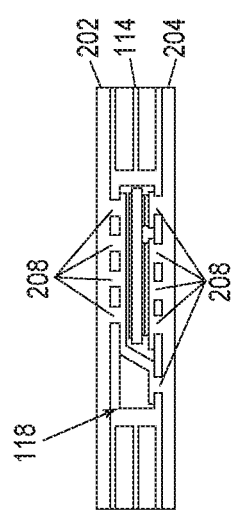
Figure 2D
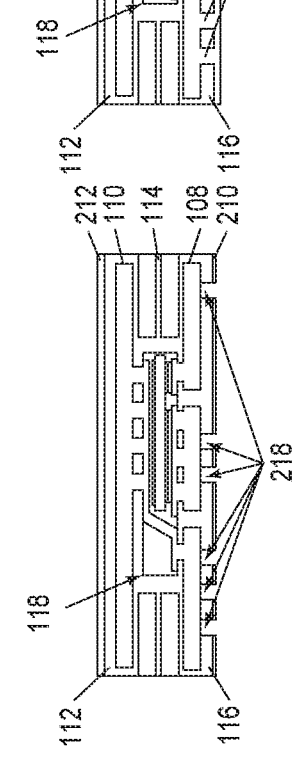
Figure 2G

US 11,632,860 B2

POWER ELECTRONIC ASSEMBLY AND METHOD OF PRODUCING THEREOF

BACKGROUND

In many power electronic applications, effective cooling of power semiconductor components is a limiting factor for the achievable power output. In addition, smaller package sizes must drive more current, exacerbating the problem. Power semiconductor components embedded in a power electronic assembly are used to switch current and/or drive a load, and therefore generate substantial heat losses. Heat energy travelling from an exposed die pad of a power semiconductor component embedded in a power electronic assembly is typically dissipated to a heat sink. In most cases, a thermal interface material is used to provide adequate electrical insulation for the power electronic assembly. However, typical thermal interface materials are poor thermal conductors which creates a bottleneck in the heat transfer path out of the power electronic assembly.

Thus, there is a need for a power electronic assembly with improved thermal performance and a method for producing such a power electronic assembly.

SUMMARY

According to an embodiment of a power electronic assembly, the power electronic assembly comprises: a board comprising a plurality of metal layers laminated onto or between electrically insulating layers; and a power device embedded in the board and configured to switch a load current, wherein a first metal layer of the board provides electrical contacts at a first side of the board, wherein a second metal layer of the board provides a thermal contact at a second side of the board opposite the first side, wherein a third metal layer of the board is positioned between the first metal layer and the power device and configured to distribute the load current switched by the power device, wherein a fourth metal layer of the board is positioned between the second metal layer and the power device and configured as a primary thermal conduction path for heat generated by the power device during switching of the load current, wherein a first electrically insulating layer of the board separates the fourth metal layer from the second metal layer so that the fourth metal layer is electrically isolated from but thermally connected to the second metal layer.

According to an embodiment of a method of producing a power electronic assembly, the method comprises: laminating a plurality of metal layers onto or between electrically insulating layers to form a board; and embedding a power device in the board, the power device configured to switch a load current, wherein a first metal layer of the board provides electrical contacts at a first side of the board, wherein a second metal layer of the board provides a thermal contact a second side of the board opposite the first side, wherein a third metal layer of the board is positioned between the first metal layer and the power device and configured to distribute the load current switched by the power device, wherein a fourth metal layer of the board is positioned between the second metal layer and the power device and configured as a primary thermal conduction path for heat generated by the power device during switching of the load current, wherein a first electrically insulating layer of the board separates the fourth metal layer from the second metal layer so that the fourth metal layer is electrically isolated from but thermally connected to the second metal layer.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A through 2I illustrate the power electronic assembly during different stages of an embodiment of a production process.

DETAILED DESCRIPTION

The embodiments described herein provide a power electronic assembly having improved thermal performance and a method for producing such a power electronic assembly. The power electronic assembly includes one or more power devices embedded in a multilayer board such as a PCB (printed circuit board). At least one intermediary metal layer of the board is configured as the primary thermal conduction path for heat generated by an embedded power device during switching of a load current. An electrically insulating layer of the board electrically isolates the intermediary metal layer which forms the primary thermal conduction path from a neighboring outermost metal layer of the board. The neighboring outermost metal layer provides a thermal contact at a side of the board, and the electrically insulating layer thermally connects the intermediary metal layer to the neighboring outermost metal layer. The electrically insulating layer has a higher thermal conductivity than a typical thermal interface material, reducing the bottleneck for the heat transfer path out of the power electronic assembly.

The power electronic assembly described herein allows for the use of standard molded power packages while avoiding the challenge to handle and interconnect thin power semiconductor chips (dies). The power electronic assembly provides a clear separation of the electrical and thermal domains, and provides a shorter and wider path between the source of heat energy and an external heatsink. The intermediary metal layer of the board which forms the primary thermal conduction path provides better (lateral) spreading of the heat energy before the heat energy travels through the electrically insulating layer which provides the separation between the intermediary metal layer and the neighboring outermost metal layer of the board. The intermediary metal layer of the board which forms the primary thermal conduction path may be thicker than one, some or all of the other metal layers of the board so as to increase thermal efficiency. The board may include another intermediary metal layer configured to distribute the load current switched by each power device embedded in the board. This intermediary metal layer may also be thicker than one, some or all of the other metal layers of the board so as to reduce electrical resistance and corresponding $I^2R$ losses. The power electronic assembly also enables fine-pitch SMT (surface mount technology) on a PCB surface by removal of power devices, which need thicker solder paste, from the surfaces of the assembly board. Such an option offers additional space for more surface mount devices (SMDs) on the same PCB area. Additional advantages may be realized upon reading the following detailed description, and upon viewing the accompanying drawings.

Figure 1:
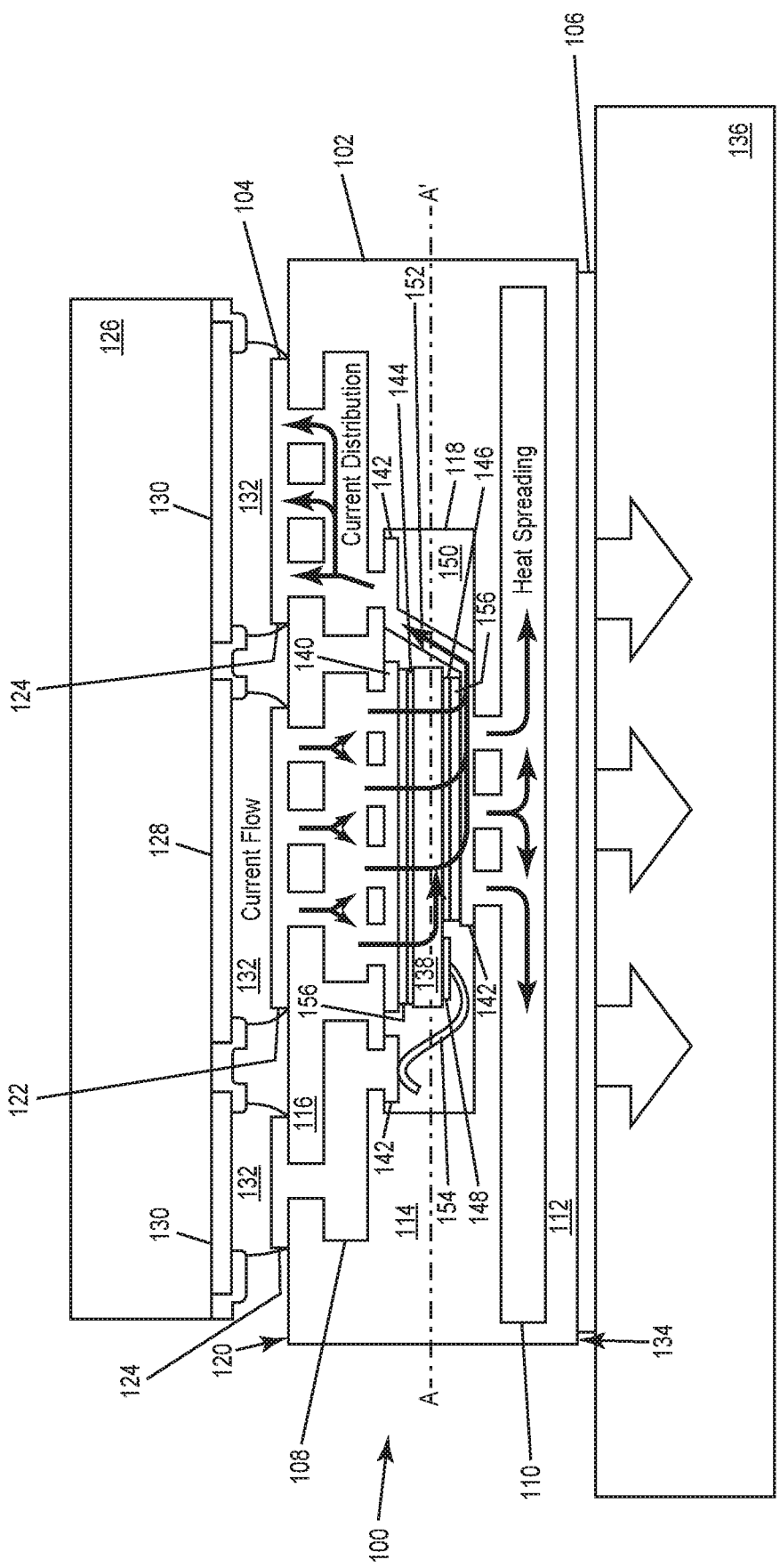
FIG. 1 illustrates a cross-sectional view of an embodiment of a power electronic assembly.

FIG. 1 illustrates a cross-sectional view of an embodiment of a power electronic assembly 100. The power electronic assembly 100 includes a multilayer board 102. The multilayer board 102 has a plurality of metal layers 104, 106, 108, 110 laminated onto or between electrically insulating layers 112, 114, 116. In one embodiment, the multilayer board 102 is a multilayer PCB. According to this embodiment, the metal layers 104, 106, 108, 110 conductive tracks, pads and/or other features may be etched from one or more sheet layers of copper to form the metal layers 104, 106, 108, 110 which are laminated onto and/or between the electrically insulating layers 112, 114, 116 of a non-conductive substrate such as FR-4 glass epoxy, polyimide, BT-epoxy which is a mixture of epoxy resin and bismaleimide-triazine (BT) resin, etc. The metal layers 104, 106, 108, 110 may or may not have the same thickness, and the electrically insulating layers 112, 114, 116 may or may not comprise the same electrically insulating material.

The power electronic assembly 100 also includes one or more power devices 118 embedded in the board 102 and configured to switch a load current. A single power device 118 is shown in FIG. 1 for ease of illustration. In general, the power electronic assembly 100 may include a single power device 118 or more than one power device 118 embedded in the board 102 and configured to switch a load current. Additional devices may be embedded in the board 102. For example, control circuitry such as a central processing unit (CPU), microprocessor, graphics processing unit (GPU), digital signal processor (DSP), artificial intelligence (AI) accelerator, image processor, network or packet processor, coprocessor, multi-core processor, front-end processor, baseband processor, etc. may be embedded in the board 102. Separately or in combination, other electronic devices such as gate drivers, level shifters, memory, capacitors, inductors, etc., may be embedded in the board 102. For example, in the case of a multi-phase voltage regulator, multiple power stages each having a half or full bridge formed by power switches, corresponding gate drivers and a controller may be embedded in the board 102. In other cases, some components of the electronic system may be located outside the board 102.

In each case, a first metal layer 104 of the board 102 provides electrical contacts at a first side 120 of the board 102. This can include one or more electrical contacts 122 for current flow into and out of each power device 118 embedded in the board, and additional electrical contacts 124 for signal routing. The board 102 may be attached or mounted to an external electronic component 126 such as a control board, one or more SMDs, etc. The external electronic component 126 attached/mounted to the board 102 has electrical contacts 128, 130 for connecting to the corresponding electrical contacts 122, 124 of the board 102. The electrical contacts 128, 130 of the external electronic component 126 are connected to the corresponding electrical contacts 122, 124 of the board 102 by an electrically conductive material 132 such as solder bumps, Cu pillars, metal clips, wire bonds, etc.

A second metal layer 106 of the board 102 provides a thermal contact at a second side 134 of the board 102 opposite the first side 120. Heat energy is expelled at the second side 134 of the board 102 via the second metal layer 106. An external cooling structure 136 such as an air or liquid cooled heatsink, an electronic control unit (ECU) housing, etc. may be attached or mounted to the thermal contact provided by the second metal layer 106 at the second side 134 of the board 102. The heat energy absorbed by the external cooling structure 136 from the thermal contact at the second side 134 of the board 102 and provided by the second metal layer 106 is indicated by wide downward-facing arrows in FIG. 1.

A third metal layer 108 of the board 102 is positioned between the first metal layer 104 and the power device 118. The third metal layer 108 of the board is configured to distribute the load current switched by the power device 118. The load current is labelled "Current Flow" and "Current Distribution" in FIG. 1.

A fourth metal layer 110 of the board 102 is positioned between the second metal layer 106 and the power device 118. The fourth metal layer 110 of the board 102 is configured as a primary thermal conduction path for heat generated by the power device 118 during switching of the load current. As used herein, the phrase "primary thermal conduction path" means a thermal path that brings out more than 50% of the heat generated by the power device 118 embedded in the board 102.

A first electrically insulating layer 112 of the board 102 separates the fourth metal layer 110 from the second metal layer 106 so that the fourth metal layer 110 is electrically isolated from but thermally connected to the second metal layer 106. In one embodiment, the board 102 is a PCB and the first electrically insulating layer 112 of the board 102 is a layer of fiberglass impregnated with resin having a thickness selected to electrically isolate the fourth metal layer 110 from the second metal layer 106. For example, the layer of fiberglass impregnated with resin may have a thickness in a range of 50 μm to 500 μm, more particularly a thickness in a range of 50 μm to 100 μm.

The thickness of the first electrically insulating layer 112 of the board 102 may be selected so as to provide sufficient electrical isolation between the fourth metal layer 110 of the board 102 and the second metal layer 106 of the board 102 but not too thick so as to unnecessarily increase thermal resistance of the first electrically insulating layer 112. This way, the first electrically insulating layer 112 of the board 102 provides sufficient electrical isolation with minimal impact on thermal resistance. The thickness of the first electrically insulating layer 112 of the board 102 depends on several factors such as the amount of heat energy generated by the power device 118, the voltage across the first electrically insulating layer 112, the composition of the first electrically insulating layer 112, etc.

In one embodiment, the first electrically insulating layer 112 of the board 102 comprises a different material than the other electrically insulating layers 114, 116 of the board 102. The first electrically insulating layer 112 may be made from a material having a higher thermal conductivity than the other electrically insulating layers 114, 116 of the board 102. In one embodiment, the thermal conductivity of the first electrically insulating layer 112 of the board 102 is at least 2 W/mK and the other electrically insulating layers 114, 116 of the board 102 each have a thermal conductivity of less than 2 W/mK. For example, the first electrically insulating layer 112 may be made from TC1203 which is a high thermal conductivity thin film offered by NAMICS Corporation and which has high breakdown voltage and high adhesion strength. TC1203 has a thermal conductivity of about 3 W/mK. The other electrically insulating layers 114, 116 of the board may be made from a standard PCB laminate material such as FR-4 which is a glass-reinforced epoxy laminate material, polyimide, BT-epoxy, etc. Such standard low-cost PCB laminate materials have a thermal conductivity in a range of about 0.6 W/mK to 1.2 W/mK.

The electrically insulating layer 116 at the opposite side 120 of the board 102 as the primary thermal conduction path is more important for signal routing than heat dissipation, so a relatively high thermal conductivity material such as TC1203 is not necessary for this electrically insulating layer 116. Other materials having a relatively thermal conductivity in a range of about 2 W/mK to 6 W/mK or even higher and which may be suitable for the first electrically insulating layer 112 at the side 134 of the board 102 with the primary thermal conduction path may include, but are not limited to, alumina (Al2O3), aluminium nitride (AlN), beryllium oxide (BeO), etc.

The board 102 may have a symmetric construction when viewed along a horizontal centreline A-A' of the board 102. This means that the first and second metal layers 104, 106 of the board 102 may have the same thickness, the third and fourth metal layers 108, 110 of the board 102 may have the same thickness, and the electrically insulating layers 112, 116 of the board 102 which separate the second and fourth metal layers 106, 110 and the first and third metal layers 104, 108, respectively, may have the same thickness.

In another embodiment, the board 102 may not have a symmetric construction when viewed along the horizontal centreline A-A' of the board 102. This means that the first and second metal layers 104, 106 of the board 102 may or may not have the same thickness, the third and fourth metal layers 108, 110 of the board 102 may or may not have the same thickness, and/or the electrically insulating layers 112, 116 of the board 102 which separate the second and fourth metal layers 106, 110 and the first and third metal layers 104, 108, respectively, may or may not have the same thickness.

In one embodiment, the fourth metal layer 110 of the board 102 is thicker than both the first metal layer 104 and the second metal layer 106 of the board. The first metal layer 104 of the board 102 is for signal routing and contact to the external electronic component 126. Limiting the thickness of the first metal layer 104 of the board 102 improves the ease with which smaller pitch components may be mounted/attached to the first side 120 of the board 102.

The second metal layer 106 of the board 102 is for contacting the external cooling structure 136 to remove the heat energy from the board 102. The second metal layer 106 of the board 102 therefore only needs to be thick enough to provide a metal-to-metal contact at the second side 134 of the board 102 and a relatively thick metallization is not needed.

Accordingly, the first and second metal layers 104, 106 of the board 102 may be thinner than the third and fourth metal layers 108, 110 of the board 102. For example, the fourth metal layer 110 and/or the third metal layer 108 of the board 102 may have a thickness in a range of 2.1 to 4.3 times a thickness of the first metal layer 104 and/or a thickness of the second metal layer 106. In the case of copper as the metal layers 104, 106, 108, 110 of the board 102, the first metal layer 104 and the second metal layer 106 may each have a thickness in a range of 35 μm to 70 μm and the fourth metal layer 110 and/or the third metal layer 108 may have a thickness in a range of 75 μm to 150 μm. Other metal/metal alloys may be used for the metal layers 104, 106, 108, 110 of the board 102, and other thickness ranges may be implemented for the metal layers 104, 106, 108, 110 of the board 102.

According to the embodiment illustrated in FIG. 1, the primary electrical path for the power device 118 is provided at one side 120 of the board 102 and the primary thermal conduction path for heat generated by the power device during switching of a load current is provided at the opposite side 134 of the board 102. Also, no thermal interface material is used between the second side 134 of the board 102 and the external cooling structure 136 thereby reducing the thermal resistance at the interface between the board 102 and the external cooling structure 136.

The power device 118 embedded in the board 102 of the power electronic assembly 100 may be any type of power device that switches a load current or drives a load. For example, the power device 118 may be a molded leadless package with single or dual side cooling, a molded gullwing package with single or dual side cooling, a molded multi-chip package with single or dual side cooling, a passive package such as an inductor or capacitor package, an SMD, a laminate inlay, an embedding package, or even an unpackaged/bare semiconductor die (chip) with no encapsulation or preassembled die that is soldered on a leadframe.

The power device 118 may include pre-packaged semiconductor components having one or more semiconductor dies 138 each having one or more power transistors such as power MOSFETs (metal-oxide-semiconductor field effect transistors), IGBTs (insulated gate bipolar transistors), HEMTs (high-electron mobility transistors), etc., power diodes, gate drivers, level shifter circuitry, etc. which can be fully tested before embedding in the substrate 102 and connected electrically and thermally e.g. with plated micro vias, plated through holes, blind vias or with soldering to a substrate that is built around the component. In one embodiment, the substrate is a leadframe having a die pad 140 to which the corresponding semiconductor die 138 is attached and leads 142 for providing electrical connects to various terminals 144, 146, 148 of the semiconductor die 138. Depending on the type of power device 118, each semiconductor die 138 may be encased in a material 150 such as a molding compound, laminate, etc. or not encased and instead embedded in the board 102 as an unpackaged/bare die. Additional electrically conductive structures such as metal clip(s) 152, bond wires, 154, die attach material 156, etc. may be provided to complete the electrical and/or structural connections within the power device 118. In the case of a metal clip 152, the metal clip 152 provides cooling at the side of the semiconductor die 138 which expels the majority of the heat energy, e.g., the drain side in the case of a vertical power MOSFET. The power semiconductor device 118 may have a standard or non-standard pinout/lead configuration. The power electronic assembly 100 may be flipped so as to have top-side cooling instead of bottom-side cooling which is shown in FIG. 1.

FIGS. 2A through 2I illustrate respective cross-sectional view of the power electronic assembly 100 during different stages of production. According to the embodiment illustrated in FIGS. 2A through 2I, the multilayer board 102 is a PCB and standard PCB processing is employed.

FIG. 2A shows the power device 118 being embedded within a core or a semi-solid adhesive 200 typically referred to as prepreg, and copper layers/foils 202, 204 arranged on the upper and lower surfaces of the core/semi-solid adhesive 200. This process is typically referred to as layup.

FIG. 2B shows the board 102 after a first lamination process. Heat and pressure are applied during the lamination process, melting and curing epoxy resin in the core/semi-solid adhesive 200 to form an intermediary electrically insulating layer 114 of the board 102 while the pressure bonds the copper layers/foils 202, 204 to upper and lower surfaces, respectively, of the intermediary electrically insulating layer 114.

FIG. 2C shows the board 102 after openings 206 are formed in the intermediary electrically insulating layer 114. The openings 206 in the intermediary electrically insulating layer 114 expose contact pads at both sides of the power device 118. Masked etching, laser drilling, etc., may be used to form the openings 206 in the intermediary electrically insulating layer 114.

FIG. 2D shows the board 102 after a plating process. The plating process fills the openings 206 formed in the intermediary electrically insulating layer 114 with metal 208 to form electrical connections between the copper layers/foils 202, 204 and the corresponding contact pads of the power device 118. In the case of copper, electrochemical deposition (ECD) may be used as the plating process. Other types of plating or deposition processes may be used, depending on the type of metal used for the board 102.

FIG. 2E shows the board 102 after a structing process. The structing process patterns or structures at least the lower copper layer/foil 204 to form the electrical traces/patterns to support current flow and signal routing to and from the power device 118. The patterned lower copper layer/foil 204 forms the third metal layer 108 of the board 102. The upper copper layer/foil 202 may or may not be patterned and forms the fourth metal layer 110 of the board 102. Accordingly, the fourth metal layer 110 of the board 102 may be a continuous metal structure or segmented into separate sections.

FIG. 2F shows the board 102 after a second layup process. The second layup process, which may be similar to the first layup process described above in connection with FIG. 2A, involves placing respective prepreg layers 210, 212 on the third and fourth metal layers 108, 100 of the board 102 and arranging additional respective copper layers/foils 214, 216 on opposing sides of the prepreg layers 210, 212.

FIG. 2G shows the board 102 after a second lamination process. As explained above in connection with FIG. 2B, the second lamination process produces an intermediary electrically insulating layer 116 which separates the first metal layer 104 of the board 102 from the copper layer/foil 214 formed on the electrically insulating layer 116. The second lamination process also produces an intermediary electrically insulating layer 112 which separates the second metal layer 106 of the board 102 from the copper layer/foil 216 formed on the electrically insulating layer 112.

FIG. 2G also shows openings 218 formed in the intermediary electrically insulating layer 116 which separates the first metal layer 104 of the board 102 from the copper layer/foil 214 formed on the electrically insulating layer 116, e.g., by laser drilling, etching, etc. The openings 218 in the intermediary electrically insulating layer 116 expose regions of the third metal layer 108 of the board to which electrical connections are to be formed.

FIG. 2H shows the board 102 after a second plating process. The plating process, which may be similar to the plating process described above in connection with FIG. 2D, fills the openings 218 formed in the intermediary electrically insulating layer 116 which separates the first metal layer 104 of the board 102 from the copper layer/foil 214 formed on the electrically insulating layer 116 with metal 220 to form the desired electrical connections between the lower copper layer/foil 210 and the third metal layer 108 of the board 102.

FIG. 2I shows the board 102 after a second structing process. The second structing process, which may be similar to the structing process described above in connection with FIG. 2E, patterns or structures at least the lower copper layer/foil 210 to form the electrical traces/patterns to support current flow and signal routing into and out of the board 102. The patterned lower copper layer/foil 210 forms the first metal layer 104 of the board 102. The upper copper layer/foil 212 may or may not be patterned and forms the second metal layer 106 of the board 102. The orientation of the power electronic assembly 100 is opposite (flipped) as to what is shown in FIG. 1, so that the power electronic assembly 100 has top-side cooling instead of bottom-side cooling.

Figure 3:
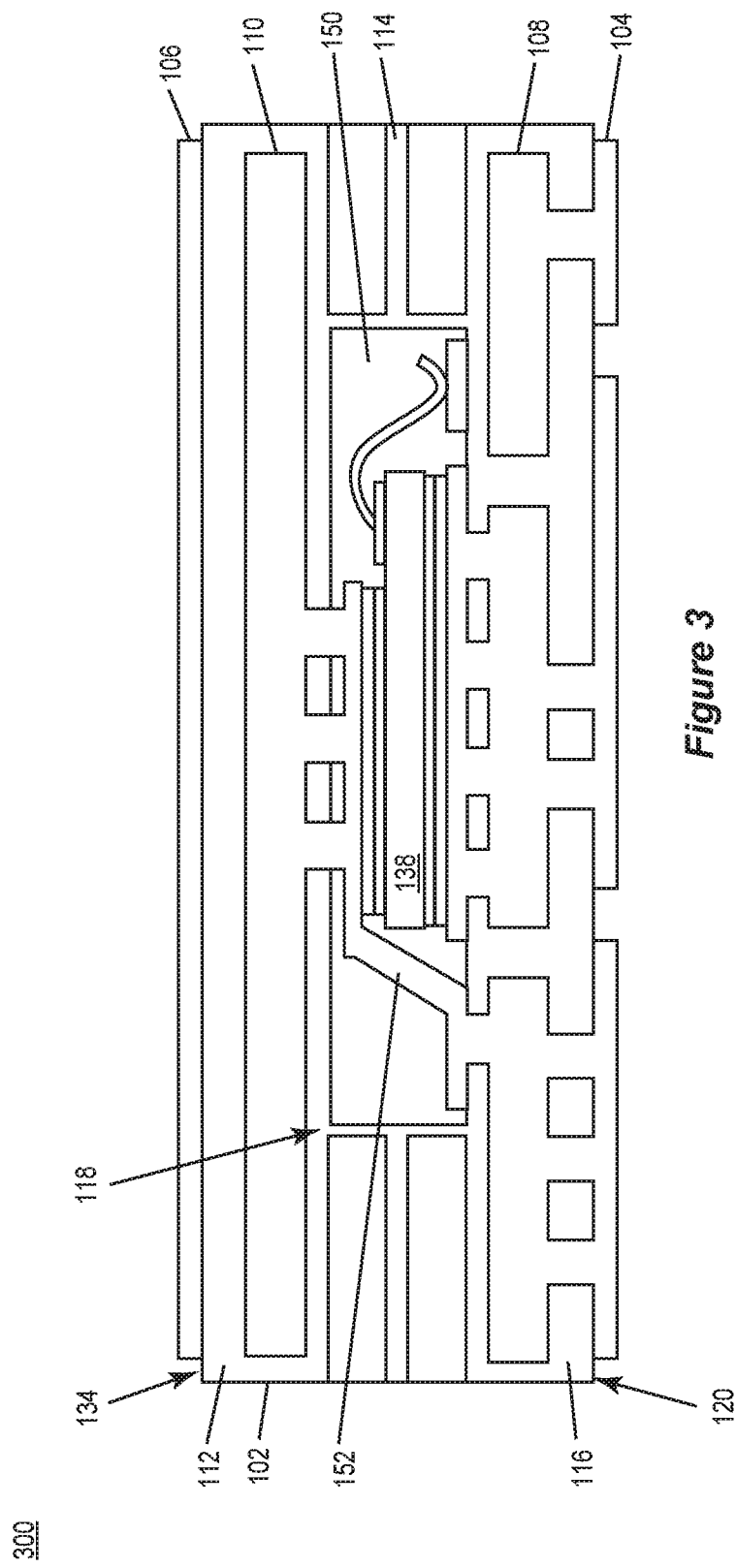
FIGS. 3 through 10 illustrate respective cross-sectional views of additional embodiments of a power electronic assembly.

FIG. 3 illustrates a cross-sectional view of another embodiment of a power electronic assembly 300. The embodiment of the power electronic assembly 300 shown in FIG. 3 is similar to the embodiment of the power electronic assembly 100 shown in FIG. 1. Different, however, the metal clip 152 is not exposed from the encapsulant material 150 of the power device 118. Instead, the top side of the metal clip 152 is covered by the encapsulant material 150. Connections to the top side of the metal clip 152 may be formed by laser drilling, mechanical drilling, etc. in a region of the encapsulant material 150 covering the top side of the metal clip 152. According to this embodiment, the power device 118 has bottom-side cooling but not top-side cooling.

Figure 4:
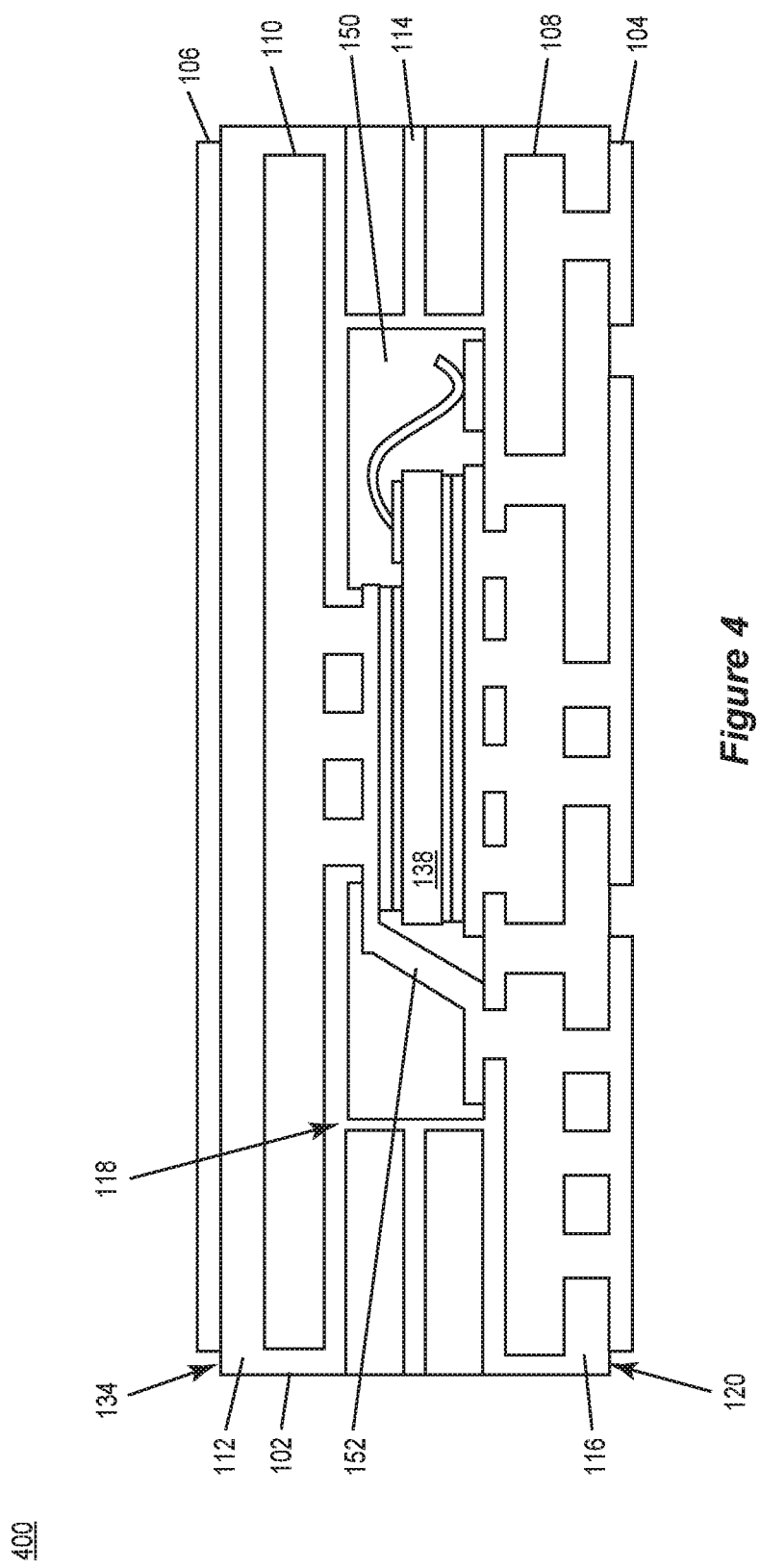

FIG. 4 illustrates a cross-sectional view of another embodiment of a power electronic assembly 400. The embodiment of the power electronic assembly 400 shown in FIG. 4 is similar to the embodiment of the power electronic assembly 300 shown in FIG. 3. Different, however, the metal clip 152 is partly exposed from the encapsulant material 150 on the top side, e.g., by laser drilling, plasma etching, water blasting, etc. of the encapsulant material 150 in a region of the top side of the metal clip 152. According to this embodiment, the power device 118 has bottom-side cooling and also top-side cooling in the region where the encapsulant material 150 was removed from the top side of the metal clip 152.

Figure 5:
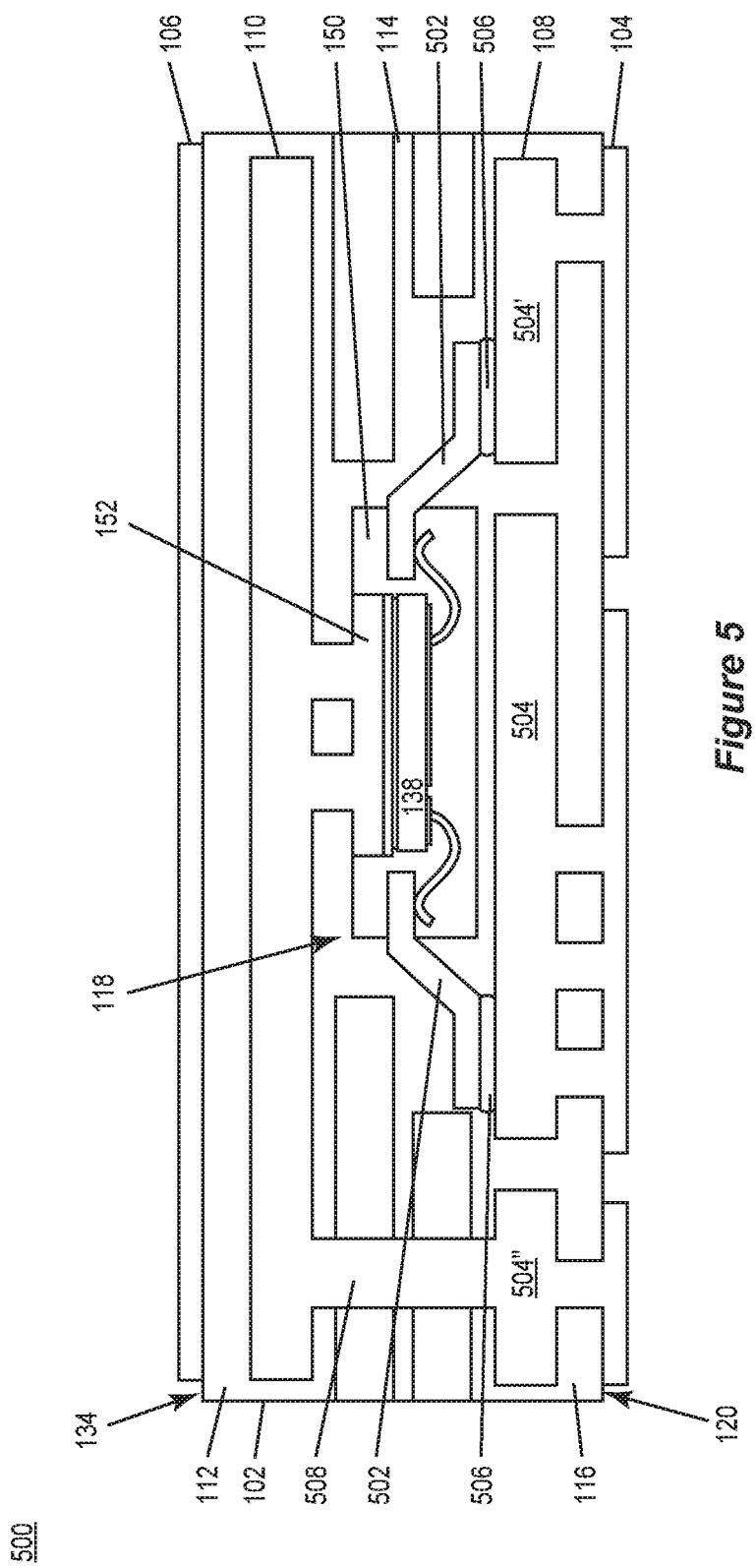

FIG. 5 illustrates a cross-sectional view of another embodiment of a power electronic assembly 500. Like the embodiments illustrated in FIGS. 1, 2I, 3 and 4, the power electronic assembly 500 has a primary thermal conduction path from the power device 118 at one side 134 of the board 102 and electrical pathways to and from the power device 118 at the opposite side 120 of the board 120. And similar to the embodiments illustrated in FIGS. 1, 2I, and 4, the top side of the metal clip 152 of the power device 118 is partly exposed from the encapsulant material 150 on the top side of the metal clip 152 so that the power device 118 has both top-side and bottom-side cooling. Different, however, the power device 118 is a leaded package instead of a leadless package. Leaded packages have small legs around the perimeter of the package, which typically either go through a PCB and are soldered on a backside (through-hole) of a PCB or directly to the front side (surface mount) of the PCB. Leadless packages restrict the contact points underneath the package instead of on the perimeter.

In FIG. 5, the leads or legs 502 of the power deice 118 which protrude from the perimeter of the encapsulant material 150 connect to respective segments 504, 504' of the third metal layer 108 of the board 102 which carries current and signals to and from the power device 118 using solder or another type of joining material 506. One segment 504 of the third metal layer 108 of the board 102 is configured to carry the load current to the power device 118. Another segment 504' of the third metal layer 108 of the board 102 may be configured to carry a switching control signal such as a gate signal to the power device 118. The third metal layer 108 of the board 102 may include an additional segment 504" configured to carry the load current away from the power device 118 and which is electrically isolated by one of the electrically insulating layers 116 of the board 102 from the segment 504 configured to carry the load current to the power device 118. According to this embodiment, the board 102 further comprises a vertical structure 508 such as a plated through hole (PTH) for electrically connecting the fourth metal layer 110 of the board 102 and which forms the primary thermal conduction path for the power device 118 to the segment 504" of the third metal layer 108 configured to carry the load current away from the power device 118. This connection may be used for some electrical routing such as a drain/collector or source/emitter connection.

Figure 6:
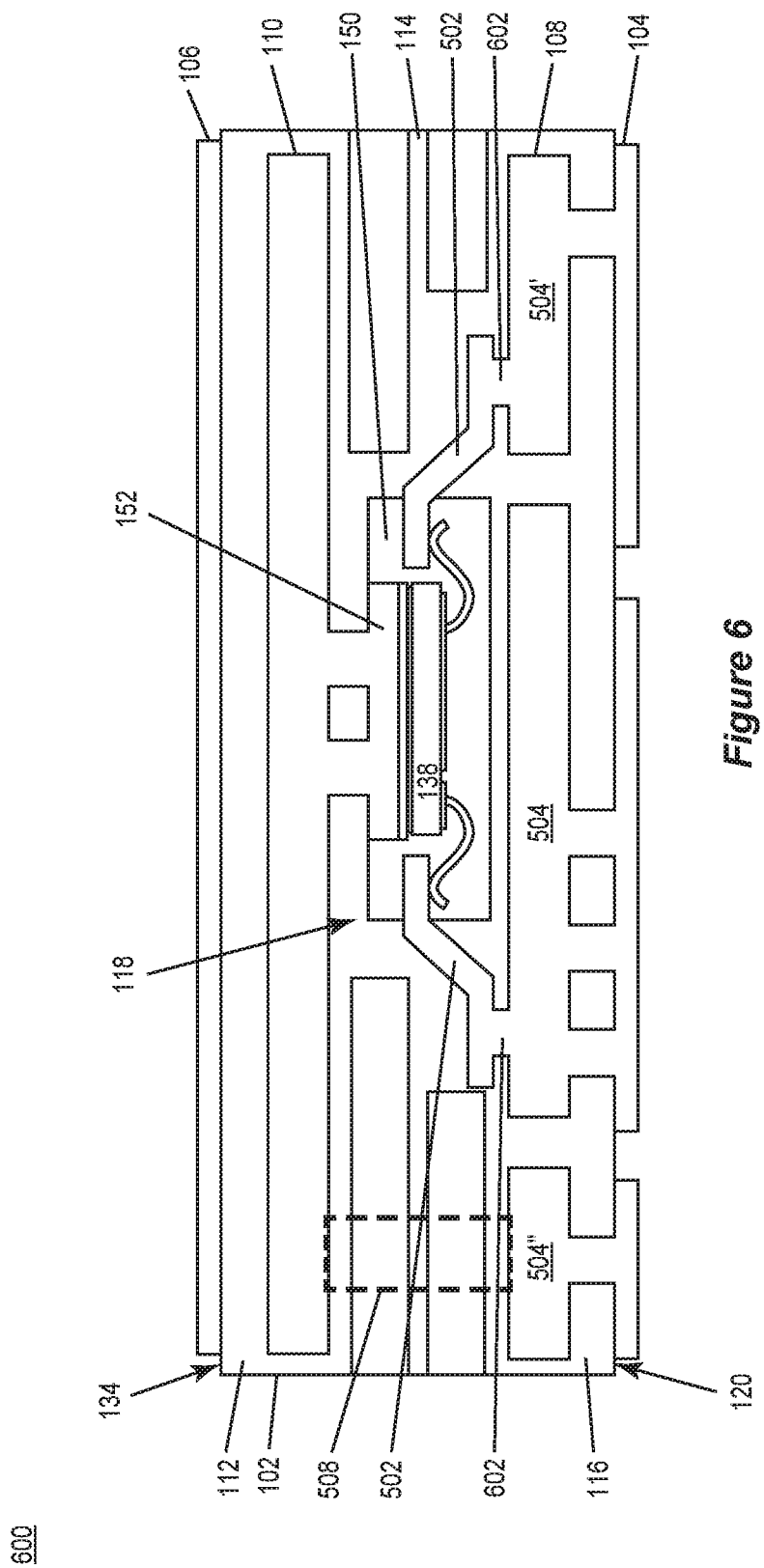

FIG. 6 illustrates a cross-sectional view of another embodiment of a power electronic assembly 600. The embodiment of the power electronic assembly 600 shown in FIG. 6 is similar to the embodiment of the power electronic assembly 500 shown in FIG. 5. Different, however, the leads or legs 502 of the leaded power deice 118 which protrude from the perimeter of the encapsulant material 150 are connected to the corresponding segments 504, 504' of the third metal layer 108 of the board 102 which carries current and signals to and from the power device 118 by respective plated vias 602 formed during a plating process of the board assembly. For example, the plated vias 602 may be formed during the plating process shown in FIG. 2D but in the case of a leaded power device 118 instead of the leadless shown in FIG. 2D. The power electronic assembly 600 shown in FIG. 6 may or may not include the vertical structure 508 for electrically connecting the fourth metal layer 110 of the board 102 which forms the primary thermal conduction path for the power device 118 to the segment 504" of the third metal layer 108 configured to carry the load current away from the power device 118, as indicated by the dashed rectangle in FIG. 6.

Figure 7:
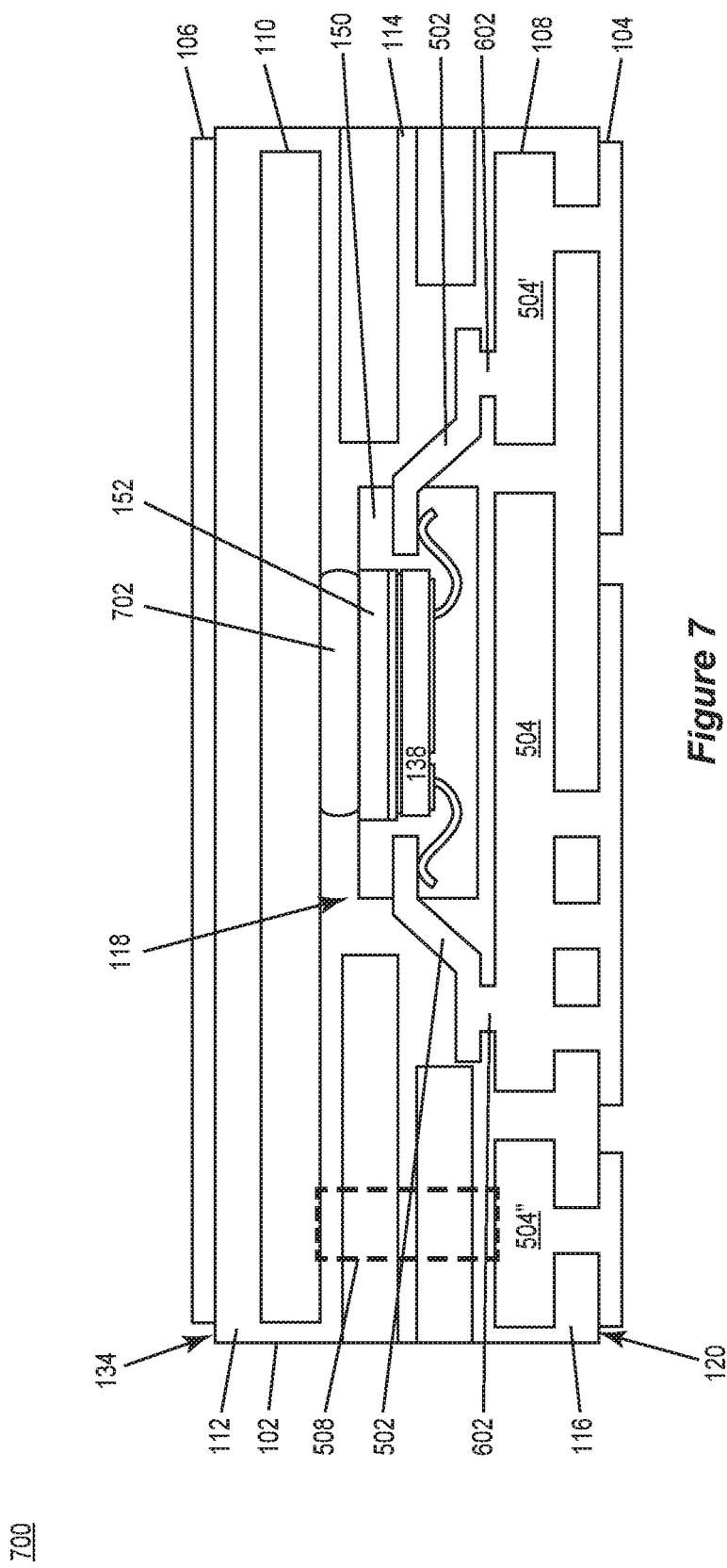

FIG. 7 illustrates a cross-sectional view of another embodiment of a power electronic assembly 700. The embodiment of the power electronic assembly 700 shown in FIG. 7 is similar to the embodiment of the power electronic assembly 600 shown in FIG. 6. Different, however, the connection between the exposed top side of the metal clip 152 of the power device 118 and the fourth metal layer 110 of the board 102 which forms the primary thermal conduction path for the power device 118 is implemented by solder or another joining material 702 instead of plated µvias or mechanically drilled blind vias.

Figure 8:
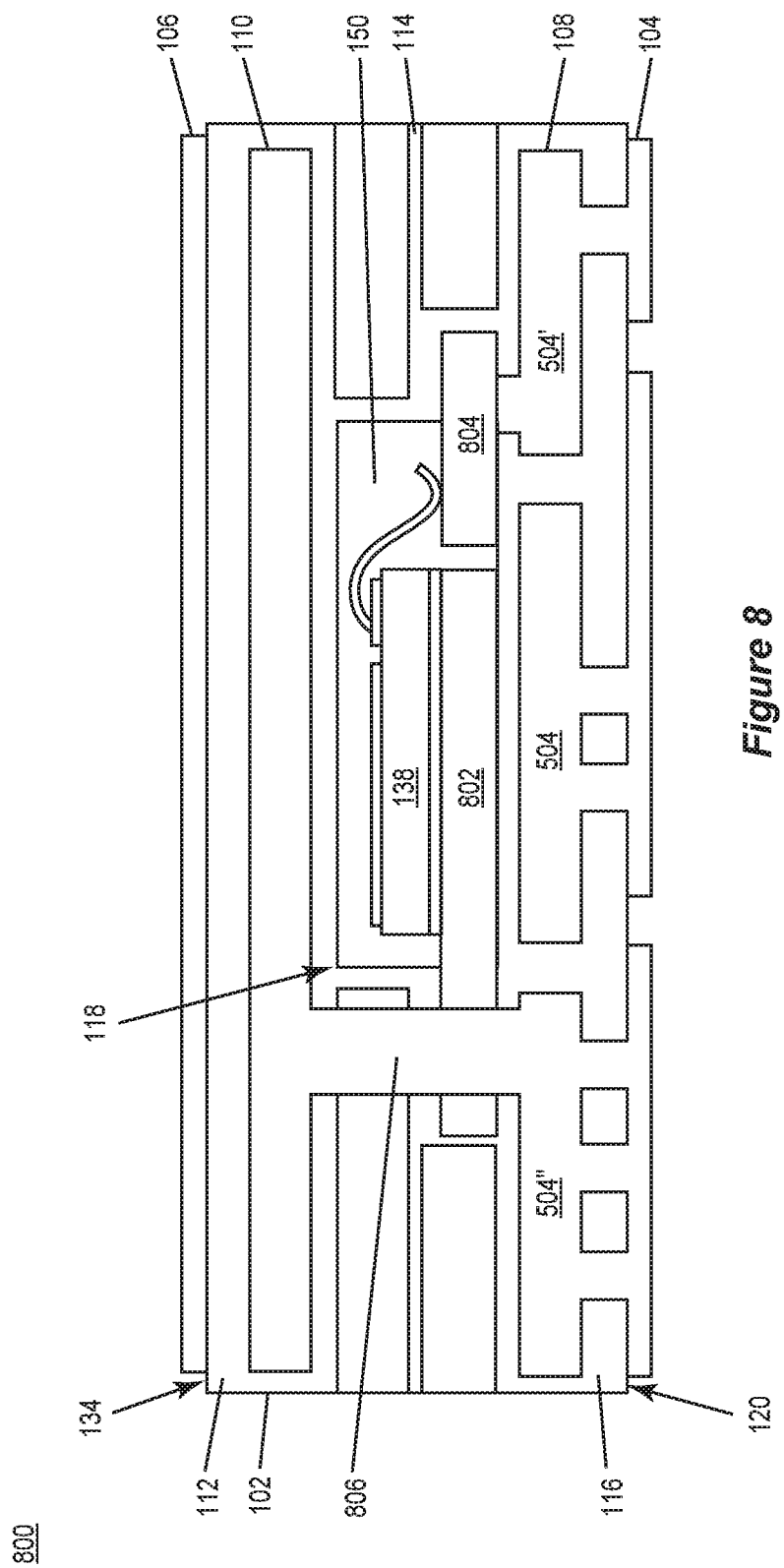

FIG. 8 illustrates a cross-sectional view of another embodiment of a power electronic assembly 800. Like the embodiments illustrated in FIGS. 1, 2I, and 3 through 7, the power electronic assembly 800 has a primary thermal conduction path from the power device 118 at one side 134 of the board 102 and electrical pathways to and from the power device 118 at the opposite side 120 of the board 120. Different, however, leads 802, 804 which are exposed at the backside of the power device 118 protrude laterally from the encapsulant material 150 and the board 102 includes a plated through hole 806 that is drilled though the exposed part of the lead 802 configured to carry load current to or from the power device 118. The connection provide by the plated through hole 806 may be used for some electrical routing such as a drain/collector or source/emitter connection.

Figure 9:
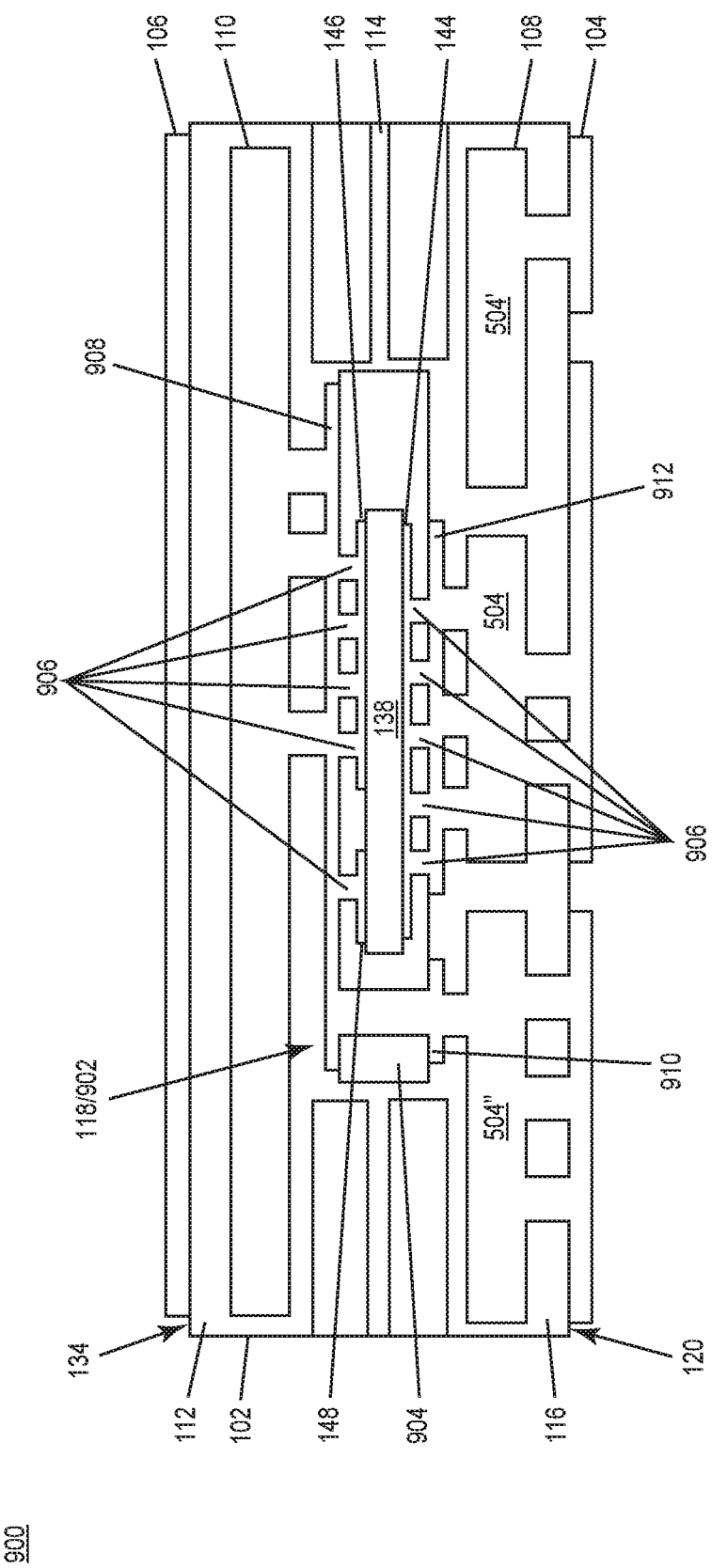

FIG. 9 illustrates a cross-sectional view of another embodiment of a power electronic assembly 900. Like the embodiments illustrated in FIGS. 1, 2I, and 3 through 8, the power electronic assembly 900 has a primary thermal conduction path from the power device 118 at one side 134 of the board 102 and electrical pathways to and from the power device 118 at the opposite side 120 of the board 120. Different, the power device 118 is embodied as a laminate inlay 902. The laminate inlay 902 may be formed using a standard PCB process and includes one or more semiconductor dies 138 embedded in a laminate substrate 904. Electrical connections to the terminals 144, 146, 148 of each semiconductor die 138 embedded in the laminate substrate 904 are formed by respective plated micro vias, plated through holes and/or blind vias 906 and corresponding plated metal traces 908, 910, 912 formed on opposite sides of the laminate substrate 904 during production of the power device inlay 902. The power device inlay 902 is in turn embedded in the board 102 during the board production process.

Figure 10:
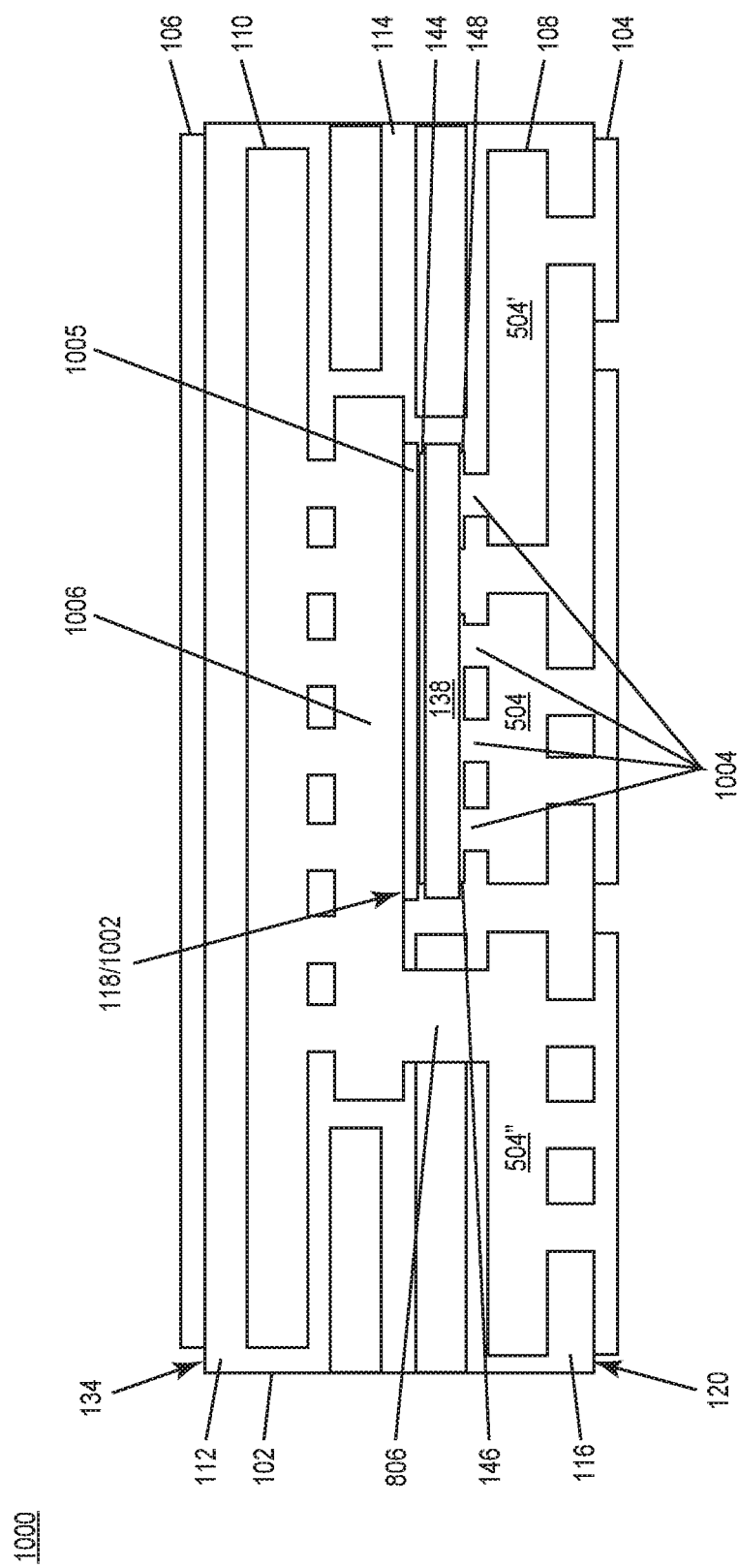

FIG. 10 illustrates a cross-sectional view of another embodiment of a power electronic assembly 1000. Like the embodiments illustrated in FIGS. 1, 2I, and 3 through 9, the power electronic assembly 1000 has a primary thermal conduction path from the power device 118 at one side 134 of the board 102 and electrical pathways to and from the power device 118 at the opposite side 120 of the board 120. Different, the power device 118 is embodied as an unpackaged or bare die 1002. Electrical connections to the terminals 146, 148 at one side of each unpackaged/bare die 1002 are provided by respective plated micro vias, plated through holes and/or blind vias 1002 formed as part of the board production process. An electrical connection to the terminal 144 at the opposite side of each unpackaged/bare die 1002 and which expels the majority (>50%) of heat generated by the unpackaged/bare die 1002 may be provided by a die attach material 1004 such as solder, e.g., during the board production process. A metal block 1006 such as a die pad of a leadframe may be pre-attached to this terminal 144 of the unpackaged/bare die 1002 prior to the board production process, or the metal block 1006 may be formed as part of the board production process, e.g., by patterning a thick copper layer/foil arranged on a prepreg. In another option, the unpackaged/bare die 1002 may be pre-soldered on a metal block/leadframe and this assembly is attached to a leadframe/Cu block to form a module which is then embedded inside a PCB. With this option, the module may be produced by soldering/diffusion soldering each unpackaged/bare die 1002 on a leadframe, cutting/dicing the assembly into single devices and then testing the devices. The unpackaged/bare die 1002 is not protected at this point by an encapsulant such as a molding compound, PCB, laminate, etc.

In each case, the board 102 may include a plated through hole 806 which connects the metal block 1006 to the segment 504" of the third metal layer 108 of the board 102 which is configured to carry the load current away from the unpackaged/bare die 1002. This connection may be used for some electrical routing such as a drain/collector or source/emitter connection.

Although the present disclosure is not so limited, the following numbered examples demonstrate one or more aspects of the disclosure.

Example 1. A power electronic assembly, comprising: a board comprising a plurality of metal layers laminated onto or between electrically insulating layers; and a power device embedded in the board and configured to switch a load current, wherein a first metal layer of the board provides electrical contacts at a first side of the board, wherein a second metal layer of the board provides a thermal contact at a second side of the board opposite the first side, wherein a third metal layer of the board is positioned between the first metal layer and the power device and configured to distribute the load current switched by the power device, wherein a fourth metal layer of the board is positioned between the second metal layer and the power device and configured as a primary thermal conduction path for heat generated by the power device during switching of the load current, wherein a first electrically insulating layer of the board separates the fourth metal layer from the second metal layer so that the fourth metal layer is electrically isolated from but thermally connected to the second metal layer.

Example 2. The power electronic assembly of example 1, wherein the fourth metal layer is thicker than both the first metal layer and the second metal layer.

Example 3. The power electronic assembly of examples 1 or 2, wherein the fourth metal layer has a thickness in a range of 2.1 to 4.3 times a thickness of the first metal layer and/or a thickness of the second metal layer.

Example 4. The power electronic assembly of any of examples 1 through 3, wherein the first metal layer and the second metal layer each have a thickness in a range of 35 µm to 70 µm, and wherein the fourth metal layer has a thickness in a range of 75 µm to 150 µm.

Example 5. The power electronic assembly of any of examples 1 through 4, wherein the first electrically insulating layer of the board is a layer of fiberglass impregnated with resin and has a thickness selected to electrically isolate the fourth metal layer from the second metal layer.

Example 6. The power electronic assembly of example 5, wherein the layer of fiberglass impregnated with resin has a thickness in a range of 50 µm to 500 µm.

Example 7. The power electronic assembly of example 5, wherein the layer of fiberglass impregnated with resin has a thickness in a range of 50 µm to 100 µm.

Example 8. The power electronic assembly of any of examples 1 through 7, wherein the first electrically insulating layer of the board comprises a different material than the other electrically insulating layers of the board.

Example 9. The power electronic assembly of any of examples 1 through 8, wherein the first electrically insulating layer of the board has a thermal conductivity greater than a thermal conductivity of the other electrically insulating layers, wherein the thermal conductivity of the first electrically insulating layer of the board is at least 2 W/mK, and wherein the other electrically insulating layers of the board each have a thermal conductivity of less than 2 W/mK.

Example 10. The power electronic assembly of any of examples 1 through 9, wherein the third metal layer comprises a first segment configured to carry the load current to the power device and a second segment configured to carry the load current away from the power device, wherein the first segment is electrically isolated from the second segment, and wherein the board further comprises a vertical structure electrically connecting the fourth metal layer to the second segment of the third metal layer.

Example 11. A method of producing a power electronic assembly, the method comprising: laminating a plurality of metal layers onto or between electrically insulating layers to form a board; and embedding a power device in the board, the power device configured to switch a load current, wherein a first metal layer of the board provides electrical contacts at a first side of the board, wherein a second metal layer of the board provides a thermal contact a second side of the board opposite the first side, wherein a third metal layer of the board is positioned between the first metal layer and the power device and configured to distribute the load current switched by the power device, wherein a fourth metal layer of the board is positioned between the second metal layer and the power device and configured as a primary thermal conduction path for heat generated by the power device during switching of the load current, wherein a first electrically insulating layer of the board separates the fourth metal layer from the second metal layer so that the fourth metal layer is electrically isolated from but thermally connected to the second metal layer.

Example 12. The method of example 11, further comprising: forming the fourth metal layer thicker than both the first metal layer and the second metal layer.

Example 13. The method of examples 11 or 12, wherein the fourth metal layer has a thickness in a range of 2.1 to 4.3 times a thickness of the first metal layer and/or a thickness of the second metal layer.

Example 14. The method of any of examples 11 through 13, wherein the first metal layer and the second metal layer each have a thickness in a range of 35 µm to 70 µm, and wherein the fourth metal layer has a thickness in a range of 75 µm to 150 µm.

Example 15. The method of any of examples 11 through 14, wherein the first electrically insulating layer of the board is a layer of fiberglass impregnated with resin and has a thickness selected to electrically isolate the fourth metal layer from the second metal layer.

Example 16. The method of example 15, wherein the layer of fiberglass impregnated with resin has a thickness in a range of 50 µm to 500 µm.

Example 17. The method of example 15, wherein the layer of fiberglass impregnated with resin has a thickness in a range of 50 µm to 100 µm.

Example 18. The method of any of examples 11 through 17, further comprising: forming the first electrically insulating layer of the board from a different material than the other electrically insulating layers of the board.

Example 19. The method of any of examples 11 through 18, wherein the first electrically insulating layer of the board has a thermal conductivity greater than a thermal conductivity of the other electrically insulating layers, wherein the thermal conductivity of the first electrically insulating layer of the board is at least 2 W/mK, and wherein the other electrically insulating layers of the board each have a thermal conductivity of less than 2 W/mK.

Example 20. The method of any of examples 11 through 19, wherein the third metal layer comprises a first segment configured to carry the load current to the power device and a second segment configured to carry the load current away from the power device, wherein the first segment is electrically isolated from the second segment, the method further comprising: forming a vertical structure in the board which electrically connects the fourth metal layer to the second segment of the third metal layer.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power electronic assembly, comprising:
a board comprising a plurality of metal layers laminated onto or between electrically insulating layers; and
a power device embedded in the board and configured to switch a load current,
wherein a first metal layer of the board provides electrical contacts at a first side that is an outer surface of the board,
wherein a second metal layer of the board provides a thermal contact at a second side that is an outer surface of the board opposite the first side,
wherein a third metal layer of the board is positioned between the first metal layer and the power device and configured to distribute the load current switched by the power device,
wherein a fourth metal layer of the board is positioned between the second metal layer and the power device and configured as a primary thermal conduction path for heat generated by the power device during switching of the load current,
wherein a first electrically insulating layer of the board separates the fourth metal layer from the second metal layer so that the fourth metal layer is electrically isolated from but thermally connected to the second metal layer.

2. The power electronic assembly of claim 1, wherein the fourth metal layer is thicker than both the first metal layer and the second metal layer.

3. The power electronic assembly of claim 1, wherein the fourth metal layer has a thickness in a range of 2.1 to 4.3 times a thickness of the first metal layer and/or a thickness of the second metal layer.

4. The power electronic assembly of claim 1, wherein the first metal layer and the second metal layer each have a thickness in a range of 35 μm to 70 μm, and wherein the fourth metal layer has a thickness in a range of 75 μm to 150 μm.

5. The power electronic assembly of claim 1, wherein the first electrically insulating layer of the board is a layer of fiberglass impregnated with resin and has a thickness selected to electrically isolate the fourth metal layer from the second metal layer.

6. The power electronic assembly of claim 5, wherein the layer of fiberglass impregnated with resin has a thickness in a range of 50 μm to 500 μm.

7. The power electronic assembly of claim 5, wherein the layer of fiberglass impregnated with resin has a thickness in a range of 50 μm to 100 μm.

8. The power electronic assembly of claim 1, wherein the first electrically insulating layer of the board comprises a different material than the other electrically insulating layers of the board.

9. The power electronic assembly of claim 1, wherein the first electrically insulating layer of the board has a thermal conductivity greater than a thermal conductivity of the other electrically insulating layers, wherein the thermal conductivity of the first electrically insulating layer of the board is at least 2 W/mK, and wherein the other electrically insulating layers of the board each have a thermal conductivity of less than 2 W/mK.

10. The power electronic assembly of claim 1, wherein the third metal layer comprises a first segment configured to carry the load current to the power device and a second segment configured to carry the load current away from the power device, wherein the first segment is electrically isolated from the second segment, and wherein the board further comprises a vertical structure electrically connecting the fourth metal layer to the second segment of the third metal layer.

11. A power electronic assembly, comprising:
a board comprising a plurality of metal layers laminated onto or between electrically insulating layers; and
a power device embedded in the board and configured to switch a load current,
wherein a first metal layer of the board provides electrical contacts at a surface of a first side that is an outer surface of the board,
wherein a second metal layer of the board provides a thermal contact at a surface of a second side that is an outer surface of the board opposite the first side,
wherein a third metal layer of the board is positioned between the first metal layer and the power device and configured to distribute the load current switched by the power device,
wherein a fourth metal layer of the board is positioned between the second metal layer and the power device and configured as a primary thermal conduction path for heat generated by the power device during switching of the load current,
wherein a first electrically insulating layer of the board separates the fourth metal layer from the second metal layer so that the fourth metal layer is electrically isolated from but thermally connected to the second metal layer.

12. The power electronic assembly of claim 11, wherein the fourth metal layer is thicker than both the first metal layer and the second metal layer.

13. The power electronic assembly of claim 11, wherein the fourth metal layer has a thickness in a range of 2.1 to 4.3 times a thickness of the first metal layer and/or a thickness of the second metal layer.

14. The power electronic assembly of claim 11, wherein the first metal layer and the second metal layer each have a thickness in a range of 35 μm to 70 μm, and wherein the fourth metal layer has a thickness in a range of 75 μm to 150 μm.

15. The power electronic assembly of claim 11, wherein the first electrically insulating layer of the board is a layer of fiberglass impregnated with resin and has a thickness selected to electrically isolate the fourth metal layer from the second metal layer.

16. The power electronic assembly of claim 15, wherein the layer of fiberglass impregnated with resin has a thickness in a range of 50 μm to 500 μm.

17. The power electronic assembly of claim 15, wherein the layer of fiberglass impregnated with resin has a thickness in a range of 50 μm to 100 μm.

18. The power electronic assembly of claim 11, wherein the first electrically insulating layer of the board comprises a different material than the other electrically insulating layers of the board.

19. The power electronic assembly of claim 11, wherein the first electrically insulating layer of the board has a thermal conductivity greater than a thermal conductivity of the other electrically insulating layers, wherein the thermal conductivity of the first electrically insulating layer of the board is at least 2 W/mK, and wherein the other electrically insulating layers of the board each have a thermal conductivity of less than 2 W/mK.

20. The power electronic assembly of claim 11, wherein the third metal layer comprises a first segment configured to carry the load current to the power device and a second segment configured to carry the load current away from the power device, wherein the first segment is electrically isolated from the second segment, and wherein the board further comprises a vertical structure electrically connecting the fourth metal layer to the second segment of the third metal layer.

* * * * *